US007834364B2

(12) United States Patent
Lee

(10) Patent No.: US 7,834,364 B2
(45) Date of Patent: Nov. 16, 2010

(54) AC LIGHT EMITTING DIODE AND METHOD FOR FABRICATING THE SAME

(75) Inventor: Jae Ho Lee, Yongin-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/652,555

(22) Filed: Jan. 5, 2010

(65) Prior Publication Data

US 2010/0096648 A1 Apr. 22, 2010

Related U.S. Application Data

(63) Continuation of application No. 11/997,287, filed as application No. PCT/KR2006/003016 on Aug. 1, 2006.

(30) Foreign Application Priority Data

Aug. 9, 2005 (KR) .............................. 2005-0072828
Aug. 22, 2005 (KR) .............................. 2005-0076874

(51) Int. Cl.
*H01L 27/15* (2006.01)
(52) U.S. Cl. .............................. 257/82; 257/88; 257/91; 257/93; 257/94; 257/95; 257/99; 257/E31.099; 257/E31.105; 257/E33.027; 257/E25.001; 438/28; 315/185 S; 315/246
(58) Field of Classification Search ................... 257/82, 257/88, 91, 93, 94, 9, 95, E31.099, E31.105, 257/E33.027, E25.001, 99; 438/28; 315/185 S, 315/246
See application file for complete search history.

(56) References Cited

U.S. PATENT DOCUMENTS

| 5,917,227 A | 6/1999 | Ogihara et al. |
| 5,955,747 A | 9/1999 | Ogihara et al. |
| 6,194,839 B1 | 2/2001 | Chang |
| 6,249,088 B1 | 6/2001 | Chang |

(Continued)

FOREIGN PATENT DOCUMENTS

JP 2004-006582 1/2004

(Continued)

*Primary Examiner*—Davienne Monbleau
*Assistant Examiner*—Hajar Kolahdouzan
(74) *Attorney, Agent, or Firm*—H.C. Park & Associates, PLC

(57) ABSTRACT

The present invention relates to an AC light emitting diode. An object of the present invention is to provide an AC light emitting diode wherein various designs for enhancement of the intensity of light, prevention of flickering of light or the like become possible, while coming out of a unified method of always using only one metal wire with respect to one electrode when electrodes of adjacent light emitting cells are connected through metal wires. To this end, the present invention provides an AC light emitting diode comprising a substrate; bonding pads positioned on the substrate; a plurality of light emitting cells arranged in a matrix form on the substrate; and a wiring means electrically connecting the bonding pads and the plurality of light emitting cells, wherein the wiring means includes a plurality of metal wires connecting an electrode of one of the light emitting cells with electrodes of other electrodes adjacent to the one of the light emitting cells.

8 Claims, 8 Drawing Sheets

U.S. PATENT DOCUMENTS

| | | |
|---|---|---|
| 6,496,973 B1 | 12/2002 | Kusuda et al. |
| 6,621,105 B2 | 9/2003 | Taninaka et al. |
| 6,635,902 B1 | 10/2003 | Lin |
| 7,078,738 B2 | 7/2006 | Nawashiro et al. |
| 7,112,824 B2 | 9/2006 | Yukimoto et al. |
| 7,213,942 B2 | 5/2007 | Jiang et al. |
| 7,417,259 B2 | 8/2008 | Sakai et al. |
| 7,531,843 B2 | 5/2009 | Lin et al. |
| 7,569,861 B2 | 8/2009 | Sakai et al. |
| 2002/0093023 A1* | 7/2002 | Camras et al. ................. 257/94 |
| 2002/0139987 A1 | 10/2002 | Collins, III et al. |
| 2004/0075399 A1 | 4/2004 | Hall |
| 2004/0080941 A1 | 4/2004 | Jiang et al. |
| 2005/0225973 A1 | 10/2005 | Eliashevich et al. |
| 2005/0253151 A1* | 11/2005 | Sakai et al. ................... 257/79 |
| 2006/0110839 A1 | 5/2006 | Dawson et al. |
| 2006/0138971 A1* | 6/2006 | Uang et al. .................. 315/291 |
| 2006/0163589 A1 | 7/2006 | Fan et al. |
| 2008/0251796 A1 | 10/2008 | Lee et al. |

FOREIGN PATENT DOCUMENTS

| | | |
|---|---|---|
| JP | 2004-014899 | 1/2004 |
| JP | 2004-079867 | 3/2004 |
| JP | 2004-320024 | 11/2004 |
| KR | 2002-0035819 | 5/2002 |
| TW | 540169 | 7/2003 |
| TW | 2004-12181 | 7/2004 |
| TW | 2005-13615 | 4/2005 |
| WO | 2006-004337 | 1/2006 |

* cited by examiner

AC LIGHT EMITTING DIODE AND METHOD FOR FABRICATING THE SAME

CROSS REFERENCE TO RELATED APPLICATIONS

This application is a continuation of U.S. patent application Ser. No. 11/997,287, filed on Jan. 29, 2008, which is the National Stage of International Application No. PCT/KR2006/003016, filed on Aug. 1, 2006, and claims priority from and the benefit of Korean Patent Application No. 2005-0072828, filed on Aug. 9, 2005 and Korean Patent Application No. 2005-0076874, filed on Aug. 22, 2005, which are all hereby incorporated by reference for all purposes as if fully set forth herein.

BACKGROUND OF THE INVENTION

1. Field of the Invention

The present invention relates to an AC (alternating current) light emitting diode including a plurality of light emitting cells arranged in a matrix form and a method of fabricating the same.

2. Discussion of the Background

A light emitting diode, which is a photoelectric conversion device having a structure in which an N-type semiconductor and a P-type semiconductor are joined together, emits light through recombination of electrons and holes. Such light emitting diodes have been widely used as display devices and backlights. Further, since the light emitting diode has less electric power consumption and a longer lifetime as compared with a conventional light bulb or fluorescent lamp, the light emitting diode is substituted for a conventional incandescent bulb or fluorescent lamp and has been widely used for the purpose of general illumination.

The light emitting diode is repeatedly turned on/off depending on the direction of a current under an AC power source. Thus, in a case where the light emitting diode is used while connected directly to the AC power source, there is a problem in that the light emitting diode does not continuously light and may easily be damaged by a reverse direction current.

To solve such a problem of the light emitting diode, a light emitting diode that can be used by connecting it directly to a high-voltage AC power source has been disclosed in PCT No. WO2004/023568(A1), entitled "LIGHT-EMITTING DEVICE HAVING LIGHT-EMITTING ELEMENTS" by SAKAI et al.

According to disclosed PCT No. WO2004/023568(A1), light emitting cells are two-dimensionally connected in series on an insulation substrate such as a sapphire substrate through metal wires to form LED arrays. Such two LED arrays are in reverse parallel on the substrate. As a result, the arrays are repeatedly turned on/off alternately by an AC power supply to emit light.

However, since the disclosed conventional technology is implemented through a unified method in which only one metal wire is always used with respect to one electrode when connecting electrodes of the adjacent light emitting cells through metal wires, various designs of AC light emitting diodes for enhancement of the intensity of light, prevention of flickering of light or the like have been limited.

As an example, if the conventional unified wire connection method is used in a case where the light emitting cells are arranged to constitute a matrix and an additional means for enhancing the intensity of light or the like is added as a portion of the elements of the matrix, there may be many difficulties in connecting the metal wires while avoiding the element added as the element of the matrix. Even though it is possible, there may be caused a problem in that the total length of the metal wires becomes extremely long.

SUMMARY OF THE INVENTION

Further, the disclosed conventional technology is configured such that the light emitting cells in the same line are repeatedly turned on/off at the same time, so that continuous and uniform light is not emitted from the substrate and thus flickering arises. In a case where the light emitting diode is used for a long time, such flickering may be a major cause for making human eyes fatigued although the flickering is not observed with naked eyes. The present inventors have conducted various studies for minimizing the aforementioned flickering, and found that the conventional unified wire connection method of using only one metal wire with respect to one electrode becomes a large obstacle in the implementation of a technique for minimizing the flickering.

An object of the present invention is to provide an AC light emitting diode wherein adaptable designs for enhancement of the intensity of light, prevention of flickering of light or the like become possible, while breaking from the conventional method of always using only one metal wire with respect to one electrode when electrodes of adjacent light emitting cells are connected through metal wires.

Another object of the present invention is to provide an AC light emitting diode wherein it is easier to employ a means such as a light guide portion for improvement of the intensity of light, while breaking from the conventional method of always using only one metal wire with respect to one electrode when electrodes of adjacent light emitting cells among light emitting cells arranged as elements of a matrix are connected through metal wires.

A further object of the present invention is to provide an AC light emitting diode wherein it is possible to solve disadvantages of the conventional technology, such as flickering of light, while breaking from the conventional method of always using only one metal wire with respect to one electrode when at least a pair of arrays are configured with light emitting cells arranged as elements of a matrix.

According to an aspect of the present invention, there is provided an AC light emitting diode comprising: a substrate; bonding pads positioned on the substrate; a plurality of light emitting cells arranged in a matrix form on the substrate; and a wiring means electrically connecting the bonding pads and the plurality of light emitting cells, wherein the wiring means at least includes a plurality of metal wires connecting an electrode of one of the light emitting cells with electrodes of other light emitting cells adjacent to the one of the light emitting cells.

Preferably, each of the plurality of light emitting cells has first and second electrodes of a P-type an N-type, a light emitting cell adjacent to two light emitting cells among the plurality of light emitting cells has a first electrode connected to a second electrode of one of the adjacent two light emitting cells through a metal wire, and a second electrode connected to a first electrode of the other of the adjacent two light emitting cells through another metal wire. Wherein, if first electrodes are P-type, then second electrodes are N-type. However, if first electrodes are N-type, then second electrodes are P-type.

Preferably, each of the plurality of light emitting cells has first and second electrodes of a P-type and an N-type, a light emitting cell adjacent to three light emitting cells among the plurality of light emitting cells has a first electrode connected to a second electrode of one of the adjacent three light emitting cells through a metal wire, and a second electrode connected to first electrodes of the others of the adjacent three light emitting cells through other two metal wires.

Preferably, each of the plurality of light emitting cells has first and second electrodes of a P-type and an N-type, a light emitting cell adjacent to four light emitting cells among the plurality of light emitting cells has a first electrode connected to first electrodes of two of the adjacent four light emitting cells through two metal wires, and a second electrode connected to second electrodes of the others of the adjacent four light emitting cells through other two metal wires.

Preferably, the AC light emitting diode according to the aspect of the present invention, further comprises light guide means further formed as an element of the matrix to focus light emitted from the plurality of light emitting cells adjacent to the at least light guide portion and to radiate the light to the outside. More preferably, the light guide means consists of a plurality of light guide portions regularly arranged at a predetermined interval.

According to another aspect of the present invention, there is provided an AC light emitting diode comprising: a substrate; bonding pads positioned on the substrate; a plurality of light emitting cells arranged as elements of a matrix on the substrate; and a wiring means electrically connecting the bonding pads and the plurality of light emitting cells, wherein the wiring means at least includes two metal wires connecting an electrode of one of the light emitting cells with electrodes of other light emitting cells adjacent to the one of the light emitting cells, and the plurality of light emitting cells include at least a pair of arrays of first and second arrays, and the two metal wires comprise a metal wire connecting the same kinds of electrodes of adjacent two of the light emitting cells provided in the same first or second array and a metal wire connecting first and second electrodes of adjacent two of the light emitting cells respectively provided in the first and second arrays.

According to the present invention, there is an advantage in that it is possible to design a variety of AC light emitting diodes for enhancing the intensity of light or minimizing flickering of light through a configuration of connecting one electrode of a light emitting cell as an element of a matrix to electrodes of other light emitting cells adjacent to the light emitting cell or to other matrix elements through two metal wires.

Figure 1:
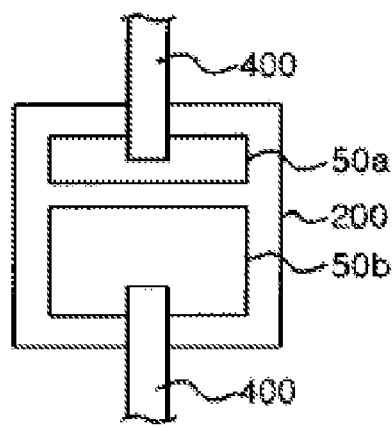
FIGS. 1 to 4 are views illustrating arrangements of metal wiring that can be applied to an AC light emitting diode according to the present invention.

Hereinafter, preferred embodiments of the present invention will be described in detail with reference to the accompanying drawings.

DETAILED DESCRIPTION OF THE ILLUSTRATED EMBODIMENTS

FIGS. 1 to 4 are views illustrating arrangements of metal wiring that can be used in connection between electrodes of light emitting cells in an AC light emitting diode according to the present invention. As shown in FIGS. 1 to 4, each of light emitting cells 200 is formed with N-type and P-type electrodes 50a and 50b, which are connected to electrodes of other light emitting cells (not shown) adjacent to the light emitting cell 200 through metal wires 400, respectively. In the descriptions of FIGS. 1 to 4, the N-type electrode 50a is referred to as a first electrode 50a and the P-type electrode 50b is referred to as a second electrode 50b for convenience of illustration. Further, the term adjacent elements used throughout the specification indicate only elements adjacent left and right or above and below and not elements adjacent diagonally.

Referring to FIG. 1, a metal wire 400 is connected to a first electrode 50a of one of the light emitting cells 200, and another metal wire 400 is also connected to a second electrode 50b thereof. The arrangement of such metal wires 400 and 400 are usefully utilized in connecting the first and second electrodes 50a and 50b of the one of the light emitting cells 200 adjacent to two light emitting cells among the plurality of light emitting cells constituting a matrix to electrodes of the adjacent light emitting cells. At this time, in a case where there is a bonding pad 300a or 300b (see FIGS. 5 and 6) among the elements of the matrix, which will be described in detail below, one of the metal wires 400 and 400 respectively connected to the first and second electrodes 50a and 50b can be connected to the bonding pad adjacent to the light emitting cell 200.

Figure 2:
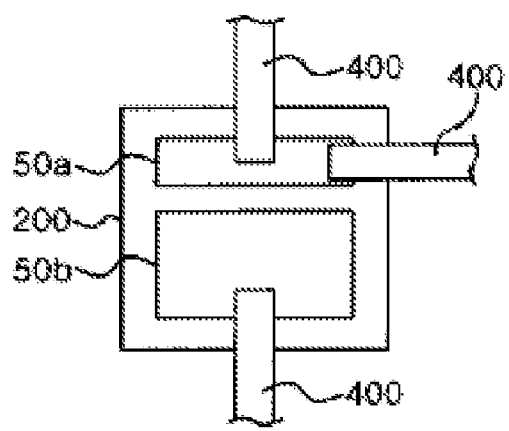

Referring to FIG. 2, a metal wire 400 is connected to a second electrode 50b of one of the light emitting cells 200, while two metal wires 400 and 400 are connected to a first electrode 50a thereof. The two metal wires 400 and 400 are used in respectively connecting the first electrode 50a provided in the one of the light emitting cells 200 to electrodes of other two light emitting cells adjacent to the one of the light emitting cells 200 or to an electrode of one of the two light emitting cells adjacent to the one of the light emitting cells 200 and a bonding pad.

Figure 3:
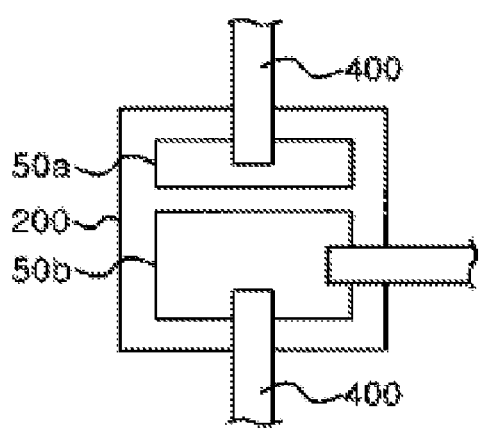

Referring to FIG. 3, a metal wire 400 is connected to a first electrode 50a of one of the light emitting cells 200, while two metal wires 400 and 400 are connected to a second electrode 50b thereof. The two metal wires 400 and 400 are used in respectively connecting the second electrode 50b provided in the one of the light emitting cells 200 to electrodes of other two light emitting cells adjacent to the one of the light emitting cells 200 or to an electrode of one of the two light emitting cells adjacent the one of the light emitting cells 200 and a bonding pad.

Since the arrangements of the metal wiring shown in FIGS. 2 and 3 are those in which two metal wires 400 and 400 are connected from an electrode (first or second electrode) of the one of the light emitting cells 200 and a metal wire 400 is connected from the other electrode, the arrangements may be preferably used in connection of the metal wiring when the light emitting cells 200 are arranged as elements of a matrix and adjacent to three matrix elements (light emitting cells, or a light emitting cell and a bonding pad).

Figure 4:
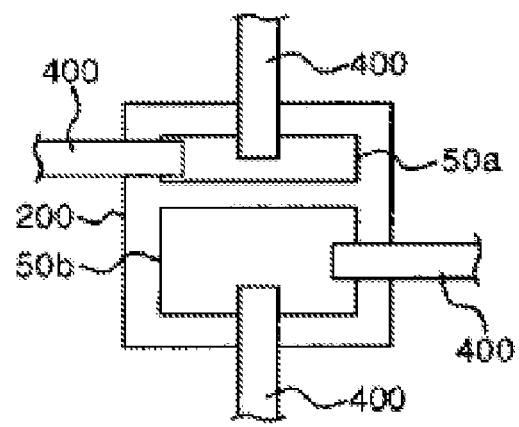

Similarly to the arrangements shown FIGS. 2 and 3, also in FIG. 4, there is shown the arrangement of the metal wiring in which two metal wires 400 and 400 are connected to each electrode of a light emitting cell 200. In the arrangement of the metal wiring shown in FIG. 4, two metal wires are connected to each of two electrodes of one of the light emitting cells 200, i.e., each of first and second electrodes 50a and 50b. The metal wires of which two are connected to each of the first and second electrodes 50a and 50b, i.e. all four metal wires are connected to matrix elements adjacent to the one of the light emitting cells 200 above, below, left and right, respectively. Further, in a case where the adjacent matrix element is a light emitting cell, the metal wire 400 is connected to an electrode of the light emitting cell, and in a case where the adjacent matrix element is a bonding pad, the metal wire 400 is connected to the bonding pad itself.

Figure 5:
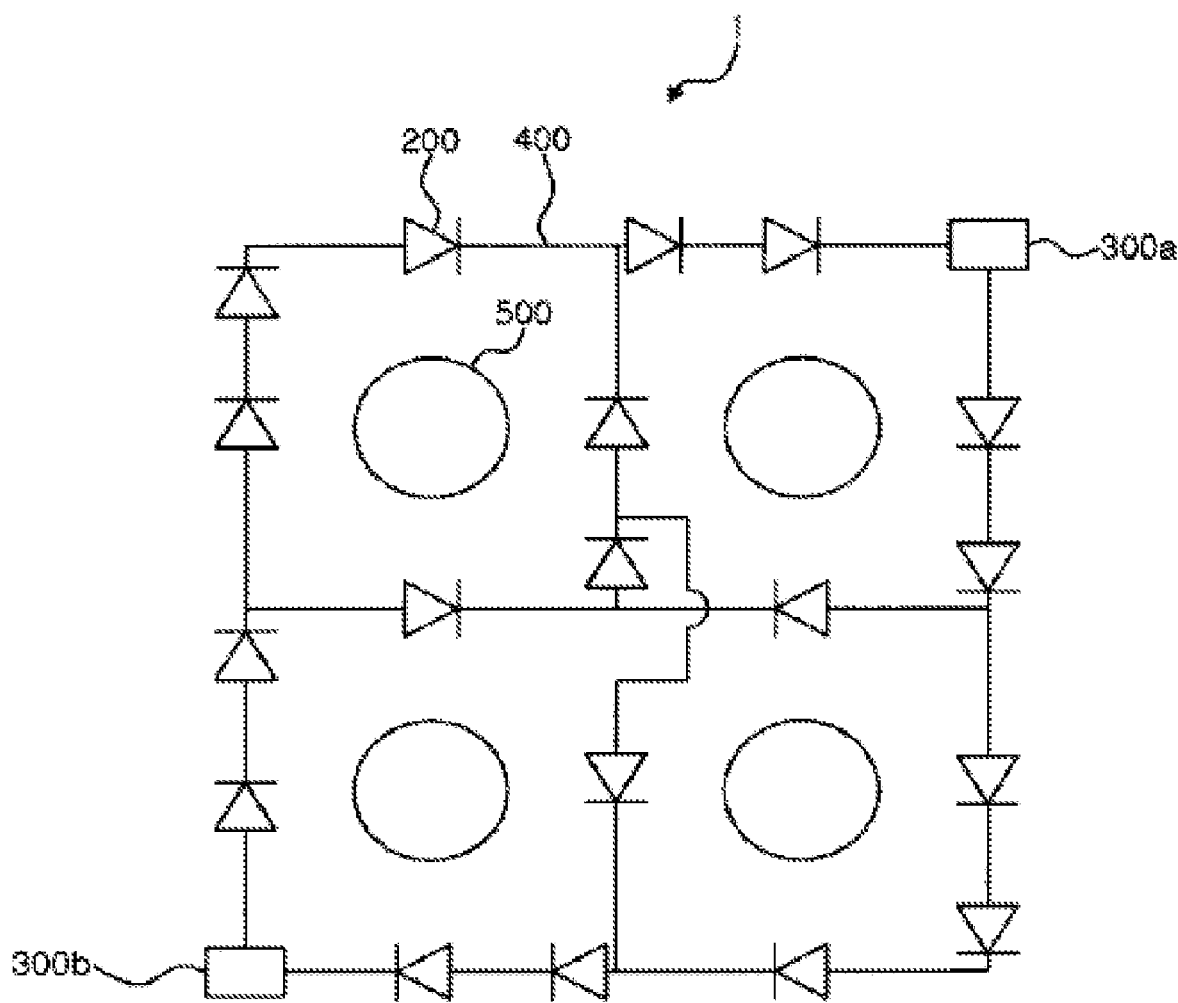
FIG. 5 is a circuit diagram of an AC light emitting diode according to a first embodiment of the present invention.
Figure 6:
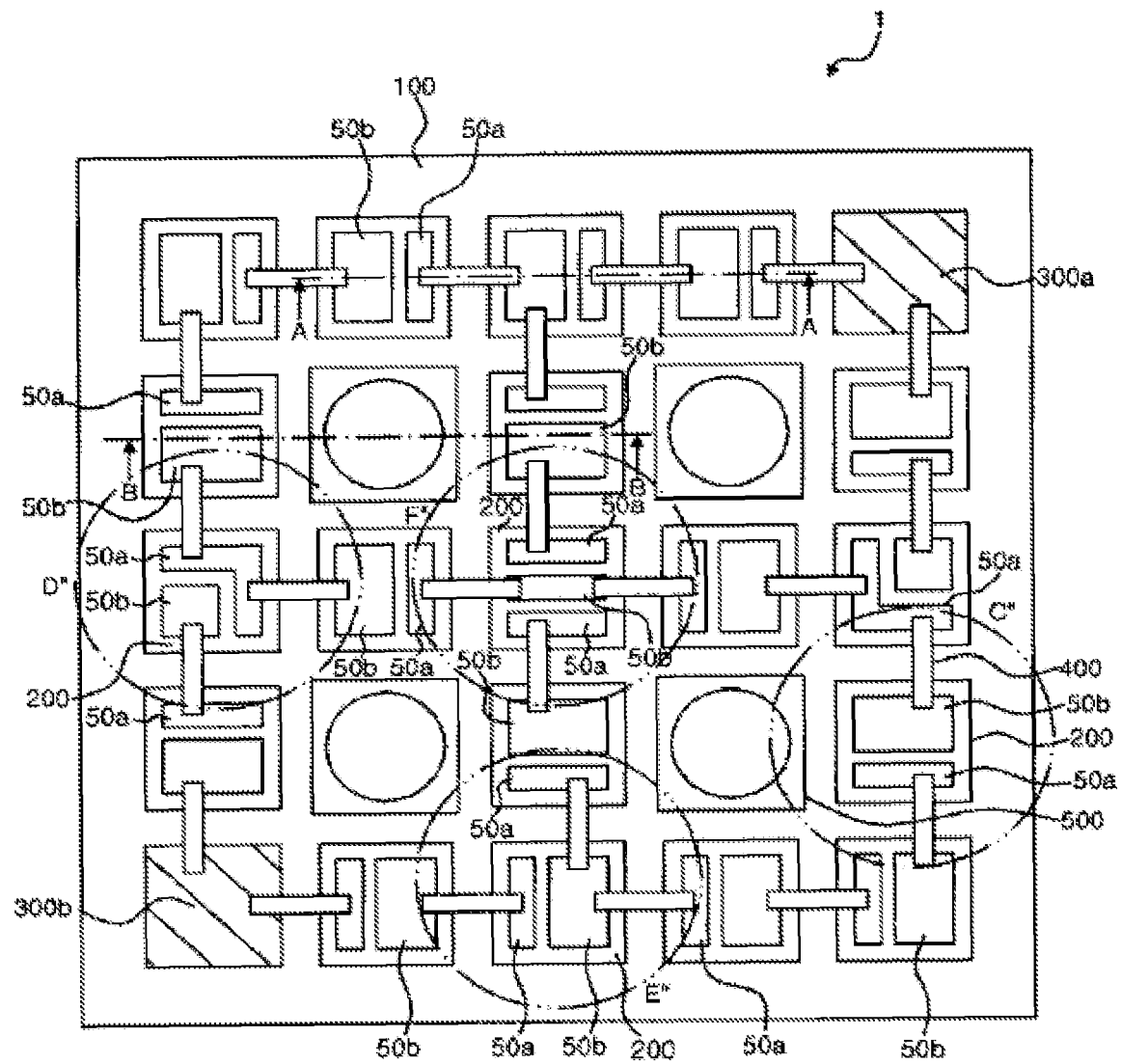
FIG. 6 is a plan view of the AC light emitting diode according to the first embodiment of the present invention.

An AC light emitting diode according to a first embodiment of the present invention that can be obtained through the arrangements of the metal wiring shown FIGS. 1 to 4, is shown in FIGS. 5 and 6 respectively as a circuit diagram and a plan view. In FIG. 6, the arrangements of the metal wires shown in FIGS. 1 to 4 are formed in circles C", D", E", and F" respectively.

That is, in circle C" of FIG. 6 is shown an arrangement in which a metal wire 400 is connected to each of first and second electrodes 50a and 50b of one of the light emitting cells 200, and the respective metal wires 400 are connected to second and first electrodes 50b and 50a of other light emitting cells adjacent to the one of the light emitting cells 200. In circle D" of FIG. 6 is shown an arrangement in which two metal wires 400 and 400 connected to a first electrode 50a of one of the light emitting cells 200 are respectively connected to second electrodes 50b and 50b of two light emitting cells adjacent to the one of the light emitting cells 200, and a metal wire 400 connected to a second electrode 50b of the one of the light emitting cells 200 is connected to a first electrode 50a of another light emitting cell adjacent to the one of the light emitting cells 200. In circle E" of FIG. 6 is shown an arrangement in which two metal wires 400 and 400 connected to a second electrode 50b of one of the light emitting cells 200 are respectively connected to first electrodes 50a and 50a of two light emitting cells adjacent to the one of the light emitting cells 200, and a metal wire 400 connected to a first electrode 50a of the one of the light emitting cells 200 is connected to a second electrode 50b of another light emitting cell 200 adjacent to the one of the light emitting cells 200. In circle F" of FIG. 6 is shown an arrangement in which two metal wires connected to a second electrode 50b of one of the light emitting cells 200 are respectively connected to first electrodes 50a and 50a of two light emitting cells adjacent to the one of the light emitting cells 200, and two metal wires connected to a first electrode 50a of the one of the light emitting cells 200 are respectively connected to second electrodes 50b and 50b of other two light emitting cells adjacent to the one of the light emitting cells 200. At this time, although the first electrode 50a is shown as if it is two electrodes in circle F" of FIG. 6, it should be noted that the first electrode 50a is practically one identical electrode.

As shown in FIGS. 5 and 6, the AC light emitting diode according to this embodiment comprises a substrate 100, light emitting cells 200, first and second bonding pads 300a and 300b, metal wires 400, and light guide portions 500.

The substrate 100 may be made of a sapphire or material such as SiC with thermal conductivity larger than a sapphire, and the plurality of patterned light emitting cells 200 are formed on the substrate 100.

Figure 7:
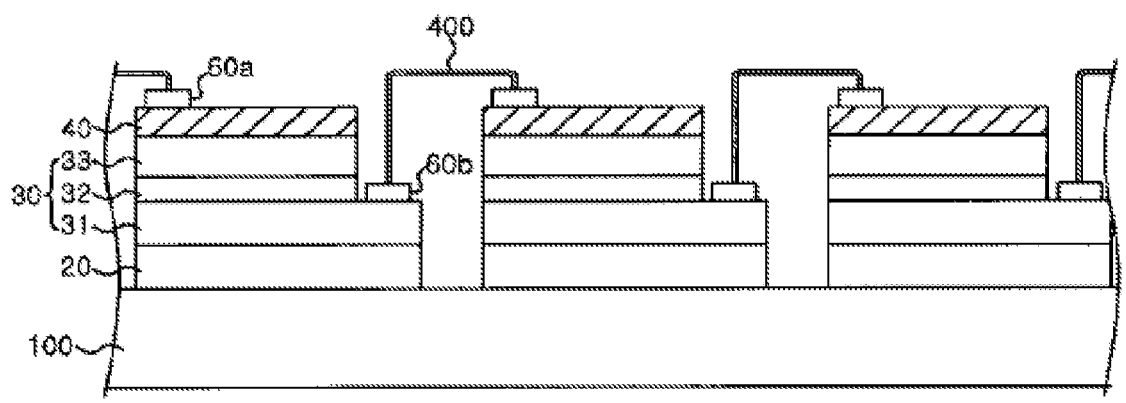
FIG. 7 is a sectional view taken along line A-A in FIG. 6.

FIG. 7 is a sectional view taken along line A-A in FIG. 6. Referring to FIG. 7, each of the light emitting cells 200 forms a structure in which an N-type semiconductor layer 31, an active layer 32 and a P-type semiconductor layer 33 are sequentially laminated. The active layer 32 is formed on a portion of the N-type semiconductor layer 31, and the P-type semiconductor layer 33 is formed on the active layer 32. Thus, the portion of a top surface of the N-type semiconductor layer 31 is joined with the active layer 32, and the other portion of the top surface is exposed to the outside.

Referring back to FIGS. 5 and 6, the light emitting cells 200 are arranged between the first and second bonding pads 300a and 300b in the form of a matrix, e.g., a square matrix.

The first and second bonding pads 300a and 300b are to connect a light emitting diode 1 to an external power source through the metal wires 400. The first and second bonding pads 300a and 300b may be connected to the external power source through bonding wires (not shown).

The metal wires 400 electrically connect the light emitting cells 200. Each of the metal wires 400 connects a first electrode 50a of one of the light emitting cells 200 to a second electrode 50b of another light emitting cell 200 adjacent to the corresponding light emitting cell 200, so that P-type and N-type semiconductor layers 33 and 31 of the adjacent light emitting cells 200 are electrically connected to each other. Also, each of the metal wires 400 electrically connects a first or second electrode 50a or 50b of one of the light emitting cells 200 to the first or second bonding pad 300a or 300b adjacent to the corresponding light emitting cell 200 thereby to supply power to the light emitting diode 1.

Some of the metal wires 400 connect first and second electrodes 50a and 50b of one of the light emitting cells 200 positioned at an intersection where a row and a column meet each other to second and first electrodes 50b and 50a of light emitting cells adjacent to the one of the light emitting cells 200, respectively. Also, some of the metal wires 400 electrically connect the bonding pad 300a or 300b positioned at an intersection where a row and a column meet each other to first and second electrodes 50a and 50b of light emitting cells adjacent to the one of the light emitting cells 200.

Particularly, one of the light emitting cells 200 positioned adjacent to two matrix elements among the light emitting cells 200 has a first electrode 50a electrically connected to a second electrode 50b of a light emitting cell 200 adjacent to the one of the light emitting cells 200 or the bonding pad 300a or 300b, and a second electrode 50b electrically connected to a first electrode 50a of another light emitting cell 200 adjacent to the one of the light emitting cells 200 or the bonding pad 300a or 300b.

In the matrix arrangement, two of the metal wires 400 are required in a case where the number of matrix elements (except light guide portions) positioned adjacent to one of the light emitting cells 200 is two. A first electrode 50a of one of a light emitting cell 200 should be connected to a second electrode 50b of another of the light emitting cells 200 for the purpose of operating a diode. Thus, there is only the same arrangement of the metal wiring as shown in FIG. 1.

In the matrix arrangement, in a case where the number of matrix elements (except light guide portions) positioned adjacent to one of the light emitting cells is three, a first electrode 50a of the corresponding light emitting cell 200 may be connected to any one of a second electrode 50b of a light emitting cell 200 adjacent to the corresponding light emitting cell 200 and the bonding pad 300a or 300b through a metal wire 400, and a second electrode 50b of the corresponding light emitting cell 200 may be connected to first electrodes 50a of two light emitting cells 200 adjacent to the corresponding light emitting cell 200 or a first electrode 50a of a light emitting cell adjacent to the corresponding light emitting cell 200 and the bonding pad 300a or 300b through two metal wires 400 and 400.

Further, in a case where the number of matrix elements (except light guide portions) positioned adjacent to one of the light emitting cells is three as described above, a first electrode 50a of the corresponding light emitting cell 200 may be electrically connected to second electrodes 50b of two light emitting cells 200 adjacent to the corresponding light emitting cell 200 or a second electrode 50b of a light emitting cell adjacent to the corresponding light emitting cell 200 and the bonding pad 300a or 300b through two metal wires 400 and 400, and a second electrode 50b of the corresponding light emitting cell 200 may be electrically connected to any one of a second electrode 50b of another light emitting cell 200 adjacent to the one of the light emitting cells 200 and the bonding pad 300a or 300b through one metal wire 400.

That is, in the matrix arrangement, in a case where the number of matrix elements (except light guide portions) positioned adjacent to a light emitting cell is three, the aforementioned three metal wires 400 for the corresponding light emitting cell are required for the purpose of operating a diode (see FIGS. 2 and 3).

Also, a first electrode 50a of one of the light emitting cells 200 positioned adjacent to four of the light emitting cells 200 is electrically connected to second electrodes 50b of two of the four light emitting cells 200 adjacent to the corresponding light emitting cell 200, and a second electrode 50b of the corresponding light emitting cell is electrically connected to first electrodes 50a of the other two light emitting cells 200 adjacent thereto. In addition, a first electrode 50a of one of the light emitting cells 200 positioned adjacent to three of the light emitting cells 200 and one of the bonding pads 300a and 300b is electrically connected to second electrodes 50b of two of the three light emitting cells 200 adjacent to the corresponding light emitting cell 200, and a second electrode 50b of the corresponding light emitting cell is electrically connected to a first electrode 50a of another light emitting cell 200 adjacent thereto and the bonding pad 300a or 300b; alternatively, the first electrode 50a of the corresponding light emitting cell 200 is electrically connected to a second electrode 50b of one of the three light emitting cells 200 adjacent to the corresponding light emitting cell 200 and the bonding pad 300a or 300b, and the second electrode 50b of the corresponding light emitting cell is electrically connected to first electrodes 50a of the other two light emitting cells 200 adjacent to the corresponding light emitting cell 200.

In the matrix arrangement, in a case where the number of matrix elements (except light guide portions) positioned adjacent to one of the light emitting cells is four, a pair of metal wires are required for each electrode of the corresponding light emitting cell 200, that is a total of four metal wires 400 are required, and a first electrode 50a of the corresponding light emitting cell 200 should be connected to second electrodes 50b of other light emitting cells 200 for the purpose of operating a diode (see FIG. 4).

The light guide portions 500 are formed to be arranged together with the light emitting cells 200 and the bonding pads 300a and 300b in a matrix form, and function to guide light emitted from a plurality of the light emitting cells 200, which are positioned adjacent to the light guide portions 500, to be focused and radiated to the outside. Particularly, it is preferred that the light guide portions 500 be regularly arranged to be spaced apart from each other at predetermined intervals and thus a fabricating process of the light emitting diode 1 can be simplified and fabricating costs can be reduced.

It will be apparent that a shape of the light guide portion 500 as viewed from above may have an angled shape such as a quadrangle or pentagon although it is a circle as shown in FIG. 6.

Referring back to FIG. 7, the light emitting cells 200 spaced apart from one another are positioned on the substrate 100. Each of the light emitting cells 200 comprises the N-type semiconductor layer 31, the P-type semiconductor layer 33 positioned over a portion of the N-type semiconductor layer 31, and the active layer 32 interposed between the N-type and P-type semiconductor layers 31 and 33. Here, the N-type semiconductor layer 31 serves as a first electrode 50a. Meanwhile, a second electrode 50b is formed on the P-type semiconductor layer 33. The second electrode 50b may be a transparent electrode layer 40 through which light can be transmitted. The light emitting cells 200 may be formed by forming the respective semiconductor layers 30 and the transparent electrode layer 40 on the substrate 100 and then patterning them using a photo and etching process. An electrode pad 60b may be formed on the other portion of the N-type semiconductor layer 31, and an electrode pad 60a may be formed on the second electrode 40. The electrode pads 60a and 60b may be formed at a desired position using a lift-off technique. The metal wires 400 may be formed together using an air-bridge or step-cover process.

Figure 8:
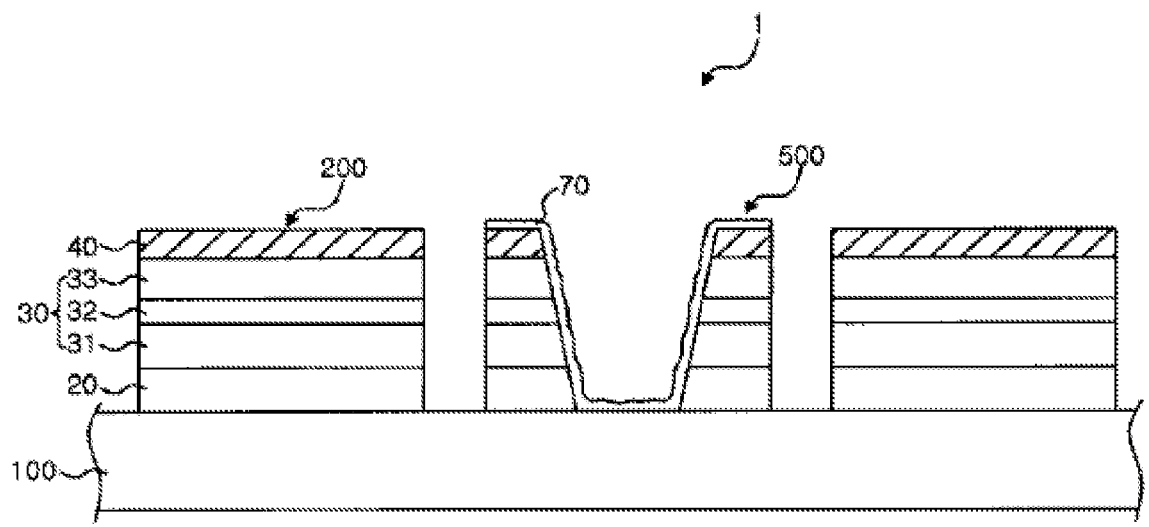
FIG. 8 is a sectional view taken along line B-B in FIG. 6.
Figure 9:
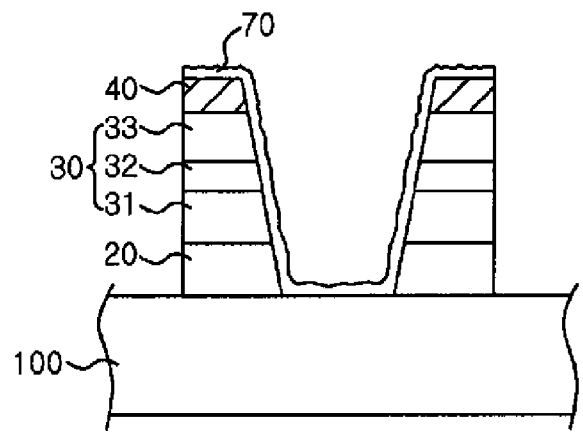
FIGS. 9 and 10 are sectional views illustrating various forms of light guide portions that may be used in the first embodiment of the present invention.
Figure 10:
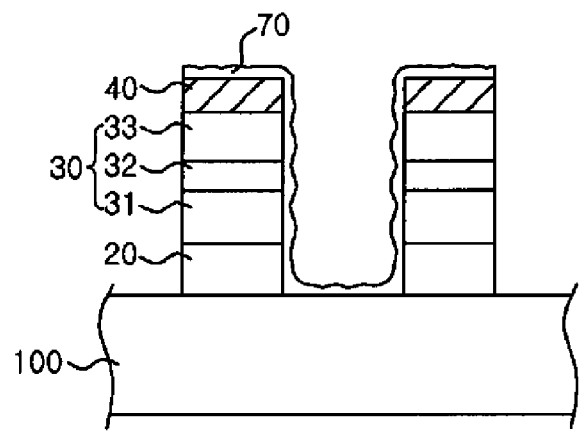

FIG. 8 is a partial sectional view taken along line B-B in FIG. 6. Referring to FIG. 8, the light emitting cells 200 spaced apart from each other are positioned on the substrate 100, and one of the light guide portions 500 is positioned between the light emitting cells 200. The light emitting cells 200 have the same configuration as the light emitting cells 200 shown in FIG. 7. The light guide portion 500 may be formed by forming the semiconductor layers 30 and the transparent electrode layer 40 and then etching a central portion thereof such that the substrate 100 is exposed. The light guide portion 500 may be etched such that the central portion has a slope with respect to the substrate 100 as shown in FIG. 9 or becomes vertical to the substrate 100 as shown in FIG. 10. The light guide portion 500 serves to guide the collected light in a predetermined direction, e.g., a vertical direction to the substrate, after collecting the light emitted from the light emitting cells 200 adjacent to the light guide portion 500.

If only the light emitting cells 200 are arranged without the light guide portions 500 in a case where the light emitting cells 200 are arranged in rows and columns, e.g., a two-dimensional square shape, the luminance of light progressing in the horizontal direction with respect to the substrate 100 among the light emitted from the light emitting cells 200 is decreased as the light passes through the light emitting cells 200 adjacent thereto, so that the entire light emitting efficiency of the light emitting diode 1 is lowered. Accordingly, the light guide portions 500 are arranged at predetermined intervals to collect light incident in the horizontal direction from the light emitting cells 200 adjacent thereto and to radiate the light in the vertical direction as shown in FIGS. 5 and 6, thereby enhancing the light emitting efficiency of the light emitting diode 1.

In addition, a light reflection prevention layer 70 may be formed in the light guide portion 500 by coating the light guide portion 500 with a light reflection prevention substance for enhancing the light transmittance of the light guide portion 500. Preferably, the thickness of the light reflection prevention layer is λ/4n. Here, λ is a wavelength of light incident from the light emitting cell adjacent to the light guide portion 500, and n is a refractive index of the light reflection prevention substance. Preferably, the light reflection prevention substance is to have a refractive index of 1.3 to 1.7. For example, the light reflection prevention substance may be $SiO_2$, $Al_2O_3$ or $Si_3N_4$. The light reflection prevention layer 70 may be formed by sputtering the light reflection prevention substance on the light guide portion 500.

A method of fabricating the aforementioned AC light emitting diode will be described below with reference to FIGS. 11 to 14.

Figure 11:
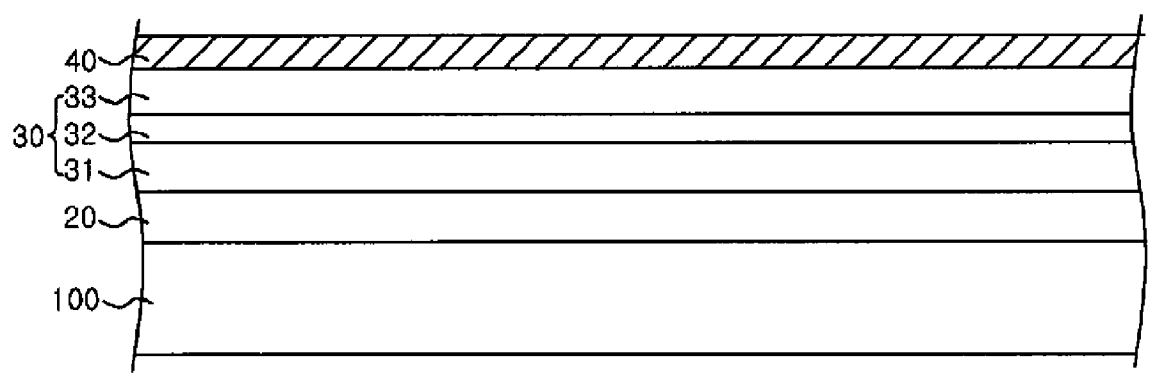
FIGS. 11 to 14 are sectional views illustrating a method of fabricating the AC light emitting diode shown in FIGS. 5 to 10.

Referring to FIG. 11, a buffer layer 20 is formed on the substrate 100, and then the N-type semiconductor layer 31, the active layer 32, the P-type semiconductor layer 33 and the transparent electrode 40 are sequentially laminated on the buffer layer 20. The buffer layer 20 and the semiconductor layers 30 may be formed using a metal organic chemical vapor deposition (MOCVD), molecular beam epitaxy (MBE) or hydride vapor phase epitaxy (HVPE) technique. Further, the semiconductor layers 30 may be consecutively formed in the same process chamber. Although the buffer layer 20 may be formed of an insulation substance film such as an AlN or semi-insulation GaN layer, it may also be made of a conductive substance film such as an N-type GaN layer if necessary. The transparent electrode layer 40 may be a transparent electrode layer made of Ni/Au or indium tin oxide (ITO).

Figure 12:
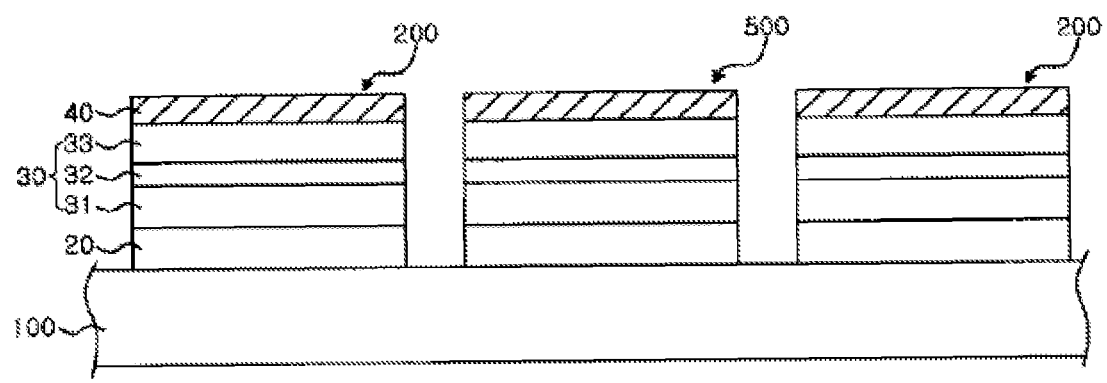

Referring to FIG. 12, after the transparent electrode layer 40 is formed, the semiconductor and transparent electrode layers 30 and 40 are patterned using photo and etching processes, thereby forming semiconductor patterns 200 and 500 arranged in a matrix form and spaced apart from one another.

Figure 13:
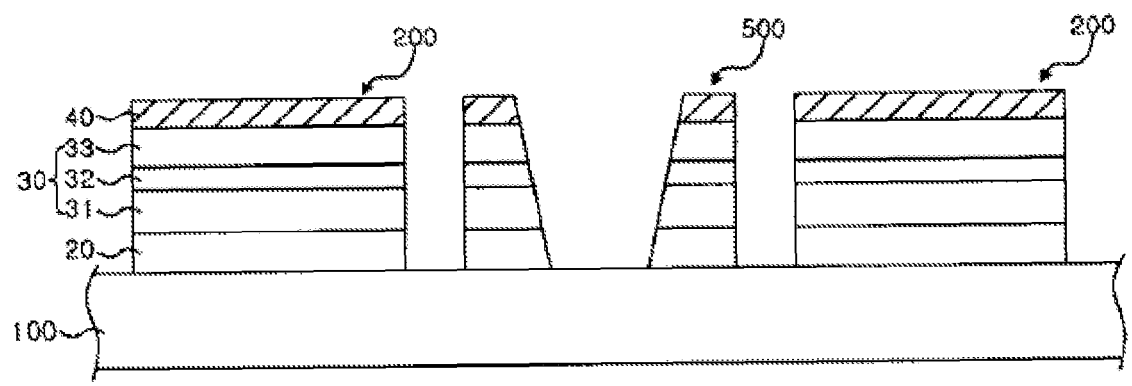

After the semiconductor patterns 200 and 500 are formed, the P-type semiconductor layer 33 and the active layer 32 are patterned in the form of semiconductor patterns to be fabricated as light emitting cells 200 among the semiconductor patterns 200 and 500 using photo and etching processes such that a portion of a top of the N-type semiconductor layer 31 is exposed. Referring to FIG. 13, thereafter, by performing a patterning process on semiconductor patterns to be fabricated as a light guide portion 500 among the semiconductor patterns 200 and 500, the light guide portion 500 is formed which has an outer circumferential portion on which light is incident from the light emitting cells 200 adjacent to the light guide portion 500 and an inner circumferential portion for guiding the incident light to be radiated in a predetermined direction. Then, an electrode pad 60b (see FIG. 7) is formed on the exposed N-type semiconductor layer 31. The electrode pad 60b may be formed using a lift-off method. Thereafter, the electrode pads 60b and 60a (see FIG. 7) of the light emitting cells adjacent to each other are connected through the metal wires 400. The metal wires 400 may be formed through an air-bridge or step-cover process.

Figure 14:
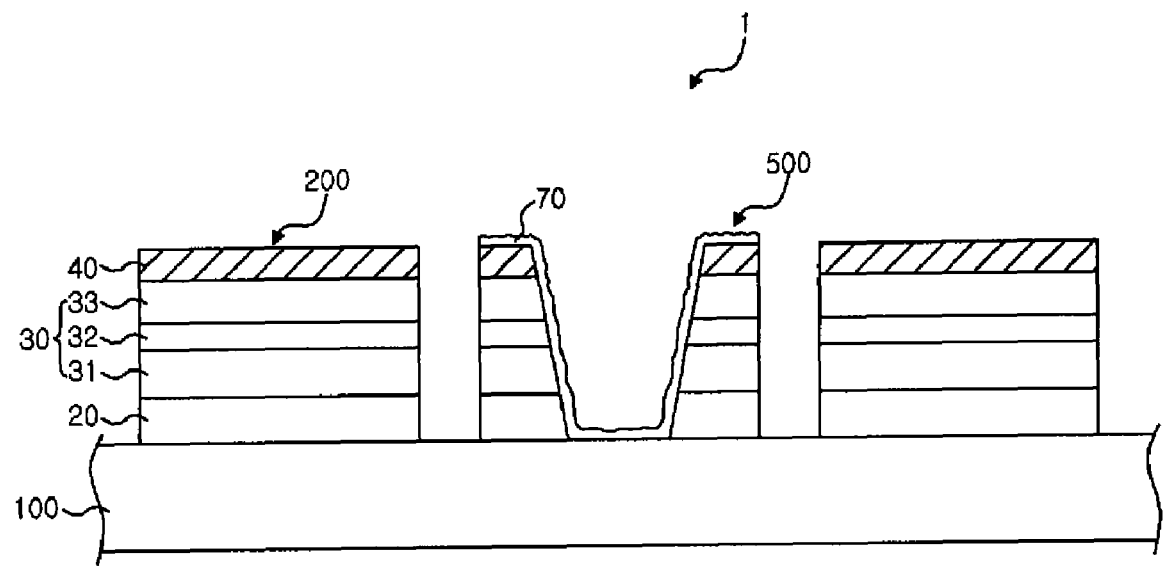

Referring to FIG. 14, after the light guide portion 500 is formed, a light reflection prevention layer 70 covering the surface of the light guide portion 500 except the outer circumferential portion is formed by sputtering a light reflection prevention substance on the light guide portion 500 in order to increase the light transmittance of light incident on the light guide portion 500. The light reflection prevention substance may be $SiO_2$, $Al_2O_3$ or $Si_3N_4$, and the thickness of the light reflection prevention layer 70 may be λ/4n. Here, λ is a wavelength of light incident from the light emitting cell 200 adjacent to the light guide portion 500, and n is a refractive index of the light reflection prevention substance.

Although it has been described in the aforementioned embodiment that the light guide portion 500 is formed after the transparent electrode layer 40 is formed, it will be apparent that the light guide portion 500 may be formed after the semiconductor layers 30 are formed.

Hereinafter, an AC light emitting device according to a second embodiment of the present invention will be described with reference to FIGS. 15 and 16. The same components as the aforementioned first embodiment of the present invention, i.e., the substrate, the first and second electrodes, and the first and second bonding pads will use like reference numerals used in the aforementioned first embodiment of the present invention. However, the reference numerals of metal wires will be used by dividing them into "400a" "400b" "400c" "400d" and "400e" depending on use contrary to the aforementioned embodiment. The second embodiment of the present invention will be completed by employing the configuration in which an electrode of one of the light emitting cells is connected to electrodes of other two light emitting cells adjacent to the one of the light emitting cells 200 through two metal wires as shown in FIGS. 2 and 3.

Figure 15:
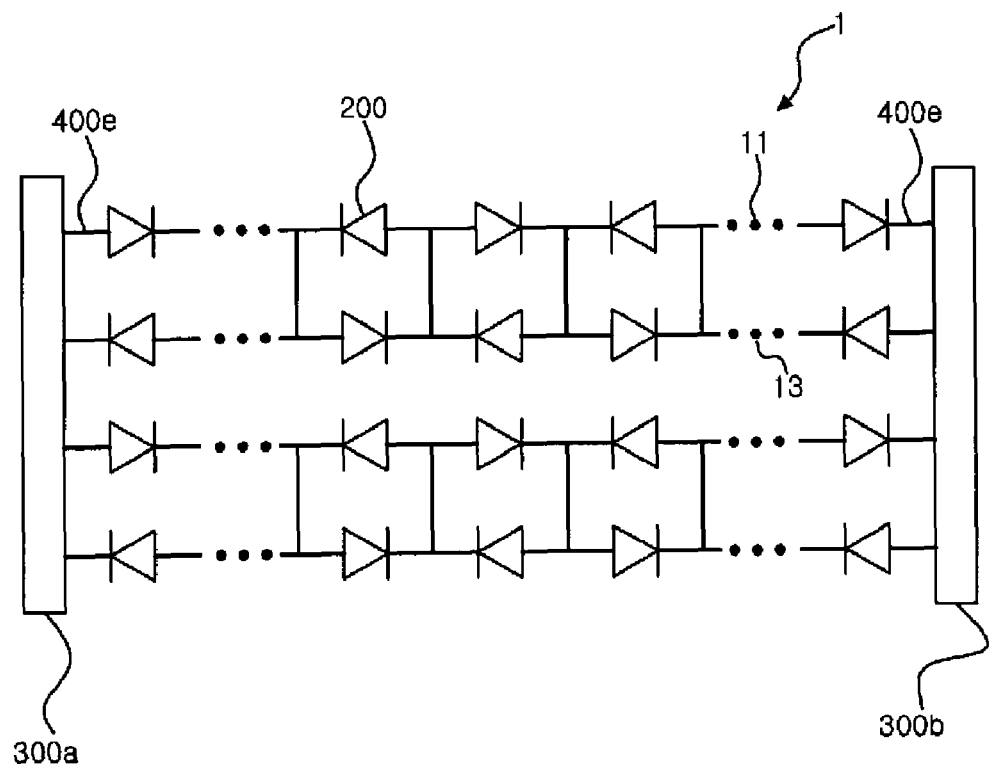
FIG. 15 is a circuit diagram of an AC light emitting diode according to a second embodiment of the present invention.
Figure 16:
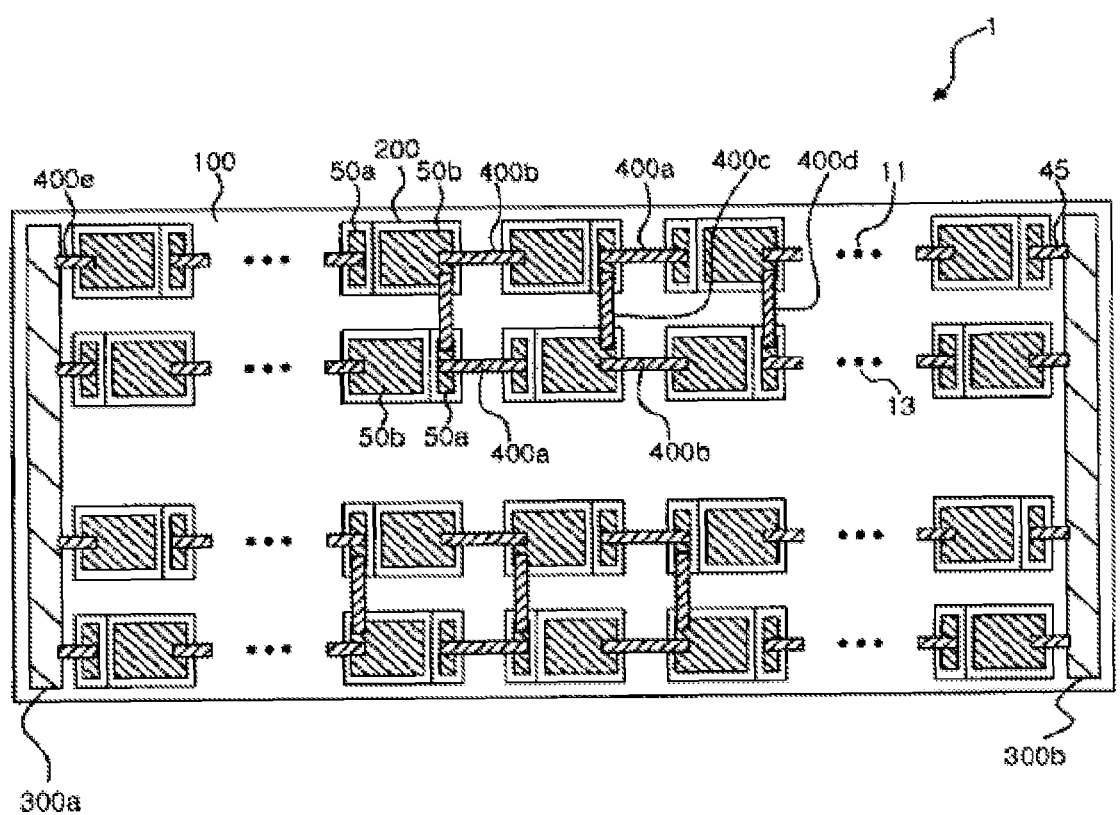
FIG. 16 is a plan view of the AC light emitting diode according to the second embodiment of the present invention.

Referring to FIGS. 15 and 16, the AC light emitting diode 1 of this embodiment has at least a pair of first and second arrays 11 and 13 of light emitting cells 200. Here, two pairs of the arrays 11 and 13 are shown. Such a pair of arrays is aligned to be adjacent to each other.

Metal wires 400a and 400b shown in FIG. 16 electrically connect the light emitting cells 200 arranged between the light emitting cells at both ends of each of the arrays. At this time, the metal wires 400a and 400b electrically connect first and second electrodes 50a and 50b of one of the light emitting cells to a first electrode 50a of one of two light emitting cells adjacent to the one of the light emitting cells 200 and a second electrode 50b of the other of the two light emitting cells adjacent thereto, so that the light emitting cells in each of the arrays are connected to one another.

The metal wires 400b for connecting the second electrodes 50b of the first array 11 are adjacent to the metal wires 400a for connecting the first electrodes 50a of the second array 13, and the metal wires 400a for connecting the first electrodes 50a of the first array 11 are adjacent to the metal wires 400b for connecting the second electrodes 50b of the second array 13.

As well shown in FIG. 16, the light emitting cells 200 are arranged so that facing electrodes of adjacent two of the light emitting cells 200 provided in the same array 11 or 13 are the same kind as the first electrode 50a or the second electrode 50b, and facing electrodes of adjacent two of the light emitting cells respectively provided in the first and second arrays 11 and 13 are different kinds from each other as the first and second electrodes 50a and 50b. Such arrangements enable the total length of the metal wires to be reduced and the metal wires to be easily connected.

For example, in a case where one of the light emitting cells 200 has the second and first electrodes 50b and 50a sequentially formed along the first array 11, the two light emitting cells adjacent to the one of the light emitting cells 200 in the same array 11 respectively have the first and second electrodes 50a and 50b sequentially formed along the first array 11. Accordingly, the length of the metal wires 400a and 400b connecting the light emitting cells 200 in the same array can be reduced. Further, the light emitting cells of the second array 13 adjacent to the first array 11 are arranged in the opposite direction of the light emitting cells of the first array 11. That is, a light emitting cell 200 of the second array 13, which is adjacent to a light emitting cell 200 of the first array 11 that has the first and second electrodes 50a and 50b in turn along the first array 11, are arranged to have the second and first electrodes 50b and 50a in turn along the second array 13.

Meanwhile, metal wires 400c and 400d electrically connect the wiring connections between the first electrodes 50a and 50a of the first array 11 to the adjacent wiring connections between the second electrodes 50b and 50b of the second array 13, respectively, and electrically connect the wiring connections between the second electrodes 50b and 50b of the first array 11 to the adjacent wiring connections between the first electrodes 50a and 50a of the second array 13, respectively. For the electrical connection between the aforementioned wiring connections, the metal wires 400c and 400d connect the first and second electrodes 50a and 50b of each of the light emitting cells 200 of the first array 11 to the adjacent second and first electrodes 50b and 50a of each of the light emitting cells of the second array 13, respectively. More specifically, the first electrode 50a of one of the light emitting cells of the first array 11 and the second electrode 50b of the light emitting cell of the second array 13 adjacent thereto are connected to each other through the metal wire 400c, and the second electrodes 50b of the light emitting cells adjacent to the one of the light emitting cells in the first array 11 the first electrodes 50a of the light emitting cells in the second array 13 adjacent thereto are connected to each other through the metal wires 400d.

The aforementioned arrangement of the metal wires 400a, 400b, 400c and 400d can be performed by connecting two metal wires to one electrode 50a or 50b of the corresponding light emitting cell 200 and by connecting the two metal wires to electrodes of other light emitting cells adjacent to the corresponding light emitting cell. The connection of such metal wires has been already described in detail in the aforementioned descriptions of FIGS. 2 and 3.

Meanwhile, the bonding pads 300a and 300b may be arranged on the substrate 100 near both the ends of the arrays 11 and 13. The bonding pads 300a and 300b are to connect the AC light emitting diode 1 to an external power source. The bonding pads 300a and 300b may be connected to the external power source through bonding wires (not shown), or may be flip-chip bonded to a submount to be connected to the external power source.

Metal wires 400e can connect the bonding pads 300a and 300b and the light emitting cells at both the ends of the first and second arrays 11 and 13. Accordingly, the light emitting cells in a pair of the arrays 11 and 13 are connected zigzag to each other to be driven under an AC power source.

According to this embodiment, since the light emitting cells of the first and second arrays 11 and 13 operate in a zigzag fashion, the light emitting cells of this embodiment may emit generally uniform light as compared with a prior art operating on a substrate in an array unit.

Meanwhile, although it has been described in this embodiment that the light emitting cells at both the ends of each of the arrays 11 and 13 are all connected to the bonding pads 300a and 300b through the metal wires 400e, it is not limited thereto and the light emitting cells at both ends of the arrays may be connected to the bonding pads 300a and 300b after a plurality of arrays are connected through metal wires.

Although the present invention has been described in detail in connection with the specific embodiments, it will be readily understood by those skilled in the art that various modifications and changes can be made thereto within the technical spirit and scope of the present invention. Accordingly, it should be construed that the aforementioned descriptions and drawings do not limit the technical spirit of the present invention but illustrate the present invention.

What is claimed is:

1. A light emitting device, comprising:
    a plurality of light emitting cells arranged on a single substrate,
    wherein one of the plurality of light emitting cells comprises three regions, one of the three regions comprising a second electrode, the other two regions each comprising a first electrode,
    wherein the second electrode is arranged on a central region of the one light emitting cell,
    wherein the second electrode of the one light emitting cell is coupled to a first electrode of an adjacent light emitting cell, and each first electrode of the one light emitting cell is coupled to a second electrode of another adjacent light emitting cell.

2. The light emitting device of claim 1, wherein the light emitting device is configured to operate on alternating current (AC) power.

3. The light emitting device of claim 2, wherein the one light emitting cell is configured to emit light in response to application of both a forward bias cycle of the AC power and a reverse bias cycle of the AC power.

4. The light emitting device of claim 1, further comprising:
    four light emitting diode arrays each comprising at least a light emitting cell of the plurality of light emitting cells,
    wherein each first electrode of the one light emitting cell is coupled to a second electrode of one of the light emitting cells of two of the light emitting diode arrays, and
    wherein the second electrode of the one light emitting cell is coupled to a first electrode of one of the light emitting cells of the other two of the light emitting diode arrays.

5. The light emitting device of claim 4, further comprising two electrodes arranged on the substrate to supply power to the one light emitting cell and the light emitting diode arrays.

6. The light emitting device of claim 5, wherein the two electrodes are arranged at diagonally opposite corners of the substrate from each other.

7. The light emitting device of claim 1, further comprising a first serial array connected in parallel to a second serial array, the first serial array comprising the one light emitting cell and the light emitting cells of two of the light emitting diode arrays.

8. A light emitting device, comprising:
    a plurality of light emitting cells arranged on a single substrate,
    wherein one of the plurality of light emitting cells comprises three regions, one of the three regions comprising a second electrode, the other two regions each comprising a first electrode,
    wherein the second electrode is arranged on a central region of the one light emitting cell,
    wherein the second electrode of the one light emitting cell is coupled to first electrodes of two adjacent light emitting cells, and each first electrode of the one light emitting cell is coupled to a second electrode of another adjacent light emitting cell.

* * * * *